(12) United States Patent  
Bayerer

(10) Patent No.: US 8,309,395 B2
(45) Date of Patent: Nov. 13, 2012

(54) METHOD OF FABRICATING A HIGH-TEMPERATURE COMPATIBLE POWER SEMICONDUCTOR MODULE

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 117 days.

(21) Appl. No.: 12/883,406

(22) Filed: Sep. 16, 2010

(65) Prior Publication Data

US 2011/0070695 A1    Mar. 24, 2011

(30) Foreign Application Priority Data

Sep. 18, 2009   (DE) .......................... 10 2009 029 577

(51) Int. Cl.
*H01L 21/50* (2006.01)

(52) U.S. Cl. ................ 438/107; 257/578; 257/E21.499; 257/E23.023; 257/E23.026; 438/612; 438/615; 438/617; 438/650; 438/686; 438/687; 228/179.1; 228/180.5

(58) Field of Classification Search .................. 257/578, 257/E21.499, E23.023, E23.026; 438/107, 438/612, 615, 617, 650, 686, 687; 228/179.1, 228/180.5
See application file for complete search history.

(56) References Cited

U.S. PATENT DOCUMENTS

| 6,610,601 B2 * | 8/2003 | Li et al. ...................... 438/687 |
| 2004/0195696 A1 * | 10/2004 | Lee et al. ...................... 257/762 |
| 2007/0013046 A1 | 1/2007 | Bayerer et al. |
| 2008/0079021 A1 | 4/2008 | Bayerer et al. |
| 2008/0079145 A1 | 4/2008 | Tschirbs et al. |
| 2008/0093729 A1 | 4/2008 | Siepe et al. |
| 2008/0229575 A1 | 9/2008 | Guth et al. |
| 2008/0230589 A1 | 9/2008 | Guth et al. |
| 2008/0230905 A1 | 9/2008 | Guth et al. |
| 2009/0023250 A1 | 1/2009 | Speckels et al. |
| 2009/0085215 A1 | 4/2009 | Stecher |
| 2009/0134501 A1 | 5/2009 | Ganitzer et al. |

FOREIGN PATENT DOCUMENTS

| DE | 102005033469.5 A1 | 2/2007 |
| DE | 102006045939.3 A1 | 4/2008 |
| DE | 102008033651 A1 | 1/2009 |
| DE | 102007046556 A1 | 4/2009 |
| DE | 102008057817 A1 | 6/2009 |

* cited by examiner

*Primary Examiner* — Peniel M Gumedzoe
(74) *Attorney, Agent, or Firm* — Murphy, Bilak & Homiller, PLLC

(57) ABSTRACT

The invention relates to a method for fabricating a high-temperature compatible power semiconductor module in which a power semiconductor chip is bonded by means of a diffusion solder layer to a substrate and said substrate is bonded by means of silver sintered layer to a base plate, after which a bonding element is bonded to the top chip metallization. To prevent oxidation of the predefined bond area when producing the diffusion solder layer and the sintered silver layer 4' an anti-oxidation layer is applied to the top chip metallization at least in the region of the predefined bond area.

19 Claims, 5 Drawing Sheets

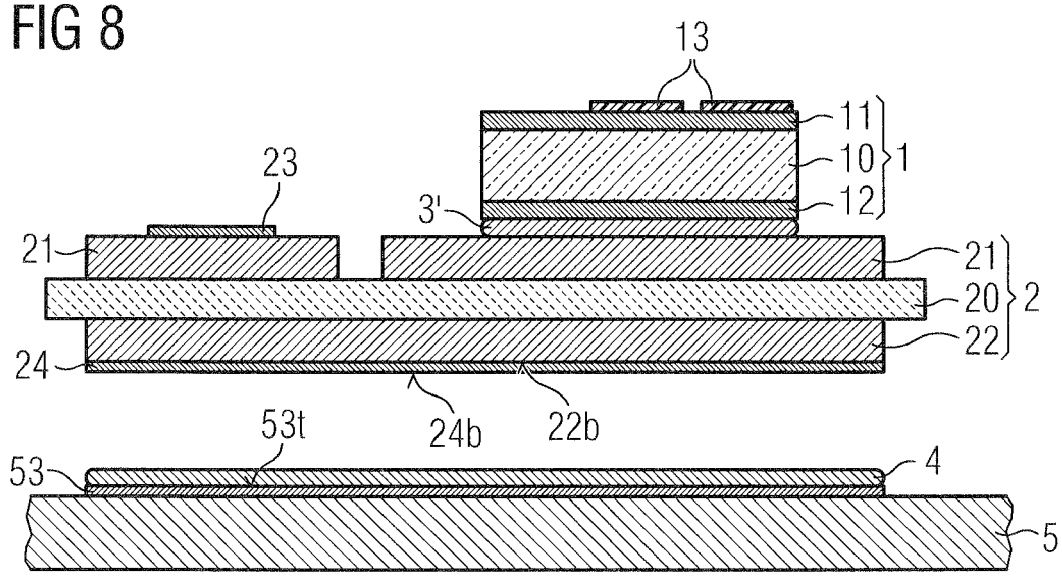
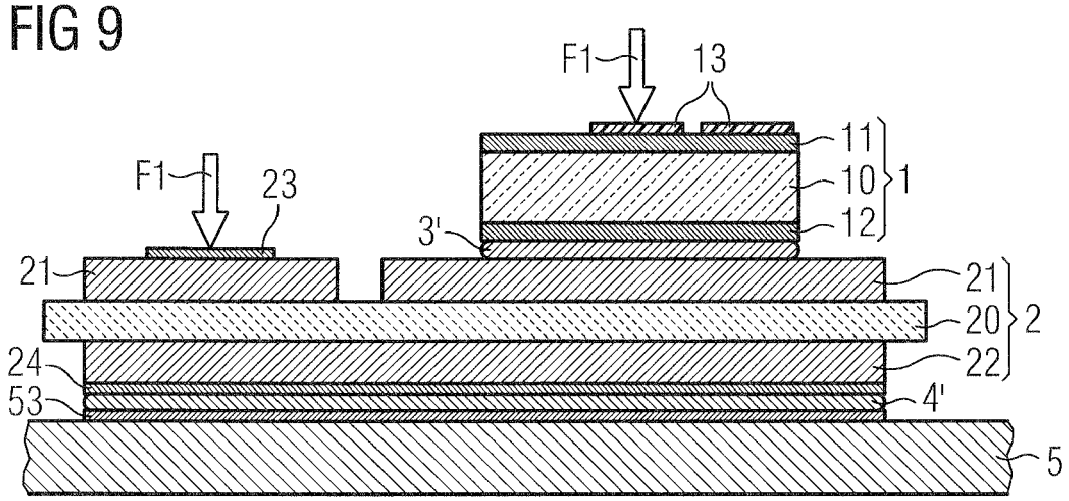

METHOD OF FABRICATING A HIGH-TEMPERATURE COMPATIBLE POWER SEMICONDUCTOR MODULE

PRIORITY CLAIM

This application claims priority from German Patent Application No. 10 2009 029 577.1-33, which was filed on 18 Sep. 2009, and is incorporated herein by reference in its entirety.

FIELD OF THE INVENTION

The invention relates to a method for fabricating a high-temperature compatible power semiconductor module.

BACKGROUND

Modern power semiconductor chips, for example IGBTs, MOSFETs, JFETs, etc. attain very high junction temperatures in operation. To dissipate the resulting waste heat the power semiconductor chips are mounted on metallized ceramic substrates which may be bonded to a secure base plate of the power semiconductor module. Due to the high achievable chip temperatures the bonding layers between the power semiconductor chip and the ceramic substrate and between the ceramic substrate and the base plate are likewise exposed to very high temperatures. Since conventional solder bonds lack adequate long-term stability at such high temperatures, diffusion soldering is being developed or e.g. pressure sintering has already become established as a means for producing alternative bonding layers. Thus, for example, a power semiconductor chip may be bonded by means of a diffusion solder layer to the metallization topping the substrate whilst a pressure sintered bond may be used to bond the metallization bottoming the substrate. The top side of the semiconductor chip facing away from the ceramic substrate is contacted by means of a bond wire.

However, producing such an assembly is anything but trivial since the various bonding processes need to satisfy diverse requirements which have negative consequences for each other in part. For instance, producing a diffusion solder bond between the semiconductor chip and the substrate necessitates an adequate soldering temperature, as a result of which the top chip metallization and the surfaces of the substrate metallization located outside of the diffusion solder bond become oxidized with the problem that the bond to the top chip metallization and/or to the top substrate metallization lacks long-term stability due to oxide layers on the metallization, e.g. layers of copper oxide on copper metallizations to be bonded, negatively influencing the long-term stability of the bond.

Although, it is basically possible to avoid oxidation by soldering in a vacuum process chamber, producing a sinter bonding layer between a substrate and a base plate has to be done in an oxygen atmosphere, resulting in producing both bonds necessitating in any case a change from vacuum to a process atmosphere or vice-versa, adding to the time needed for the process, reducing the throughput and thus hiking the costs involved.

If, on the other hand, the pressure sintered bond between the substrate and the base plate were to be produced as the first of the bonds needed, oxidation of the top substrate metallization would occur during sintering in the zones in which the diffusion soldering between the power semiconductor chip and the top substrate metallization or in which a bond to the top substrate metallization is to happen with the drawback that oxide layers on a metallization to be soldered hamper diffusion of metal from the metallization into the molten solder, significantly lowering the quality of a diffusion solder bond to be produced. As already described, this applies correspondingly to a bond on an oxidized metal surface.

If, instead, the wire bonds were produced first, this would make it impossible to subsequently produce a pressure sintered bond between the substrate componented with the power semiconductor chip and the base plate, because this would require contact pressure being applied to the full surface of the power semiconductor chip and the substrate, which is prohibitive, however, when wire bonds already top the chip since they cannot withstand the pressure.

SUMMARY

A power semiconductor module is fabricated in which a metallized ceramic substrate can be bonded to a base plate by means of a sinter bonded layer and by means of a diffusion solder layer to a power semiconductor chip for reliable long-term, high-temperature operation. In one method according to the present invention a power semiconductor chip and a substrate are provided. The power semiconductor chip comprises a semiconductor bulk having a top side topped by a top chip metallization and a bottom side bottomed by a bottom chip metallization, both chip metallizations comprising copper or copper alloy. The substrate comprises a flat ceramic carrier having a top side topped by a top substrate metallization and a bottom side bottomed by a bottom substrate metallization, both substrate metallizations comprising copper or copper alloy.

The top chip metallization is then coated with an first anti-oxidation layer so that it covers at least part of the side of the top chip metallization facing away from the semiconductor bulk. Furthermore, a chip mounting area is defined at the top side of the top substrate metallization at which the power semiconductor chip is to be bonded to the top substrate metallization. In addition, the bottom substrate metallization is coated with a layer of precious metal so that it covers at least part of the side of the bottom substrate metallization facing away from the ceramic carrier.

To produce a diffusion solder layer bonding the semiconductor chip to the substrate a tin containing solder is positioned between the bottom chip metallization and the chip mounting area, after which the solder is brought into contact with the bottom chip metallization as well as within the chip mounting area with the top substrate metallization before or after the solder is melted. This results in diffusion of the copper from both the bottom chip metallization as well as from the top substrate metallization into the molten solder in forming, together with the tin, intermetallic copper-tin phases so that cooling of the solder produces a diffusion solder layer having a high melting point securely bonding the power semiconductor chip at the bottom chip metallization in the chip mounting area to the upper substrate metallization.

Further, a base plate is provided, having a top side coated with a second layer of precious metal, between which and the first precious metal layer applied to the bottom substrate metallization a silver containing paste is positioned. A sinter bonding layer is then produced between the substrate and the base plate by urging the substrate against the base plate with a contact pressure over a predefined range of temperature for a predefined period of time.

In addition, a bond wire or a bonding element in the form of a metal ribbon is provided and a bond produced between the bonding element and the top chip metallization by positioning a portion of the bonding element by means of a bonding tool on the first anti-oxidation layer and urging it into contact with the power semiconductor chip by locally breaking and penetrating the first anti-oxidation layer.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 8 illustrates a step in the method in which a silver containing paste is positioned between the layers of precious metal of the bottom substrate metallization and of the base plate;

FIG. 9 illustrates a step in the method, starting with the assembly as shown in FIG. 8, in which the ceramic substrate precomponented with the power semiconductor chip is pressed into contact at high temperature and pressure with the base plate to sinter bond it to the componented substrate;

In the following Detailed Description, reference is made to the accompanying drawings, which form a part hereof, and in which is shown by way of illustration specific embodiments in which the invention may be practiced. In this regard, directional terminology, such as "top", "bottom", "front", "back" "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION

Figure 1:
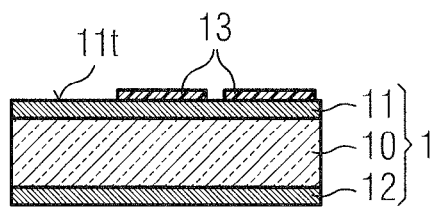
FIG. 1 Is a vertical section through a power semiconductor chip, the top chip metallization of which is coated with an anti-oxidation layer.

Referring now to FIG. 1 there is illustrated a vertical section through a power semiconductor chip 1 comprising a semiconductor bulk 10 based on, for example, silicon or silicon carbide or gallium arsenide topped at its top side 10$t$ by a top chip metallization 11 and bottomed at its bottom side 10$b$ by a bottom chip metallization 12. The top chip metallization 11 and the bottom chip metallization 12 may comprise copper or a copper alloy, for example. The top side 11$t$ of the top chip metallization 11 is blank, i.e. totally or mainly free of copper oxide. At the top side 11$t$ the top chip metallization 11 is coated with a first anti-oxidation layer 13 in at least the areas destined to produce a bond by a bond wire in preventing oxidation of the top chip metallization 11 beneath the anti-oxidation layer 13. This first anti-oxidation layer 13 may be, for example, a layer of, or including, silicon or a dielectric such as silicon nitride or silicon oxide.

When a first anti-oxidation layer 13 comprises silver its thickness can be selected very thin, e.g. to less than 1 μm or less than 500 nm, for example 100 nm, so as not to hamper the later bonding process with the top substrate metallization 21 located underneath. Correspondingly, when a first anti-oxidation layer 13 comprises a dielectric its thickness may range from 10 nm to 400 nm, for example approx. 100 nm. Dielectric anti-oxidation layers are rubbed into the metallization located underneath so that a direct copper-to-copper bond materializes between the copper of the bond wire and the copper of the metallization, i.e. a bond where the copper of the bond wire is in contact with the copper of the metallization.

Coating the top chip metallization 11 with the first anti-oxidation layer 13 can be done, for example during processing the power semiconductor chip 1 or thereafter, for example by means of sputtering or vacuum deposition using a patterned mask which leaves the areas to be coated free.

Figure 2:
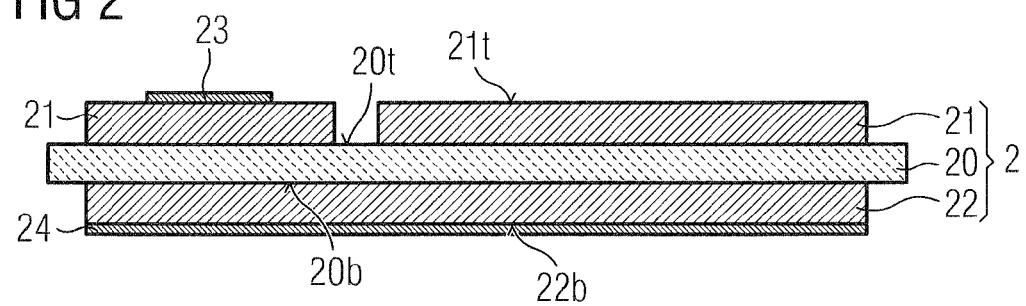
FIG. 2 is a vertical section through a ceramic substrate, the top substrate metallization of which is coated with an anti-oxidation layer and the bottom substrate metallization of which is coated with a layer of precious metal.

Referring now to FIG. 2 there is illustrated a vertical section through a ceramic substrate 2 comprising a flat ceramic carrier 20 topped at its top side 20$t$ by a top substrate metallization 21 and bottomed at its bottom side 20$b$ by a bottom substrate metallization 22. The top substrate metallization 21 and bottom substrate metallization 22 may, for example, comprise copper or a copper alloy, whilst the ceramic substrate 2 may be, for example, a direct copper bonding (DCB) or active metal brazing (AMB) substrate.

The top side 21$t$ of the top substrate metallization 21 is totally or mainly free of oxides, i.e. especially free of copper oxide. A area where later a bond is to be produced between the top substrate metallization 21 and a bond wire is coated with a second anti-oxidation layer 23 at the top side 21$t$ to prevent oxidation of the top substrate metallization 21 beneath the second anti-oxidation layer 23. The second anti-oxidation layer 23 may be, for example, a layer of silver.

The bottom side 22$b$ of the bottom substrate metallization 22 is coated with a first precious metal layer 24 needed for later production of a sinter bonding layer. This first precious metal layer 24 may comprise silver, for example.

Producing the second anti-oxidation layer 23 as well as the first precious metal layer 24 can be done in a single step, involving, for example, selective electroplating or by sputtering or vacuum deposition of silver under a patterned mask covering the area in the top side 21$t$ of the top substrate metallization 21 at which no silver is to be applied.

Figure 3:
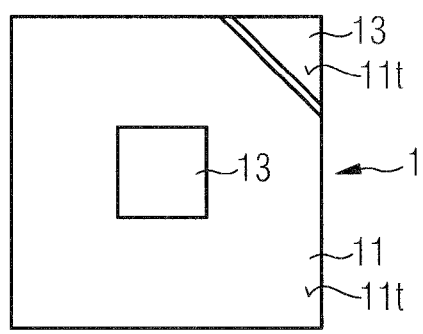
FIG. 3 is a top-down view of the power semiconductor chip coated with an anti-oxidation layer as shown in FIG. 1.

Referring now to FIG. 3 there is illustrated a top-down view of the power semiconductor chip as shown in FIG. 1 showing how the first anti-oxidation layer 13 comprises two portions each separated from the other, one of which is arranged above a load terminal of the power semiconductor chip 1, for example a source, drain, collector, emitter, anode or cathode contact and another of which is arranged above a gating terminal of the power semiconductor chip 1, for example a gate or base contact. As an alternative, the full top side 11t of the top chip metallization 11 may be coated with a first anti-oxidation layer 13.

Figure 4:
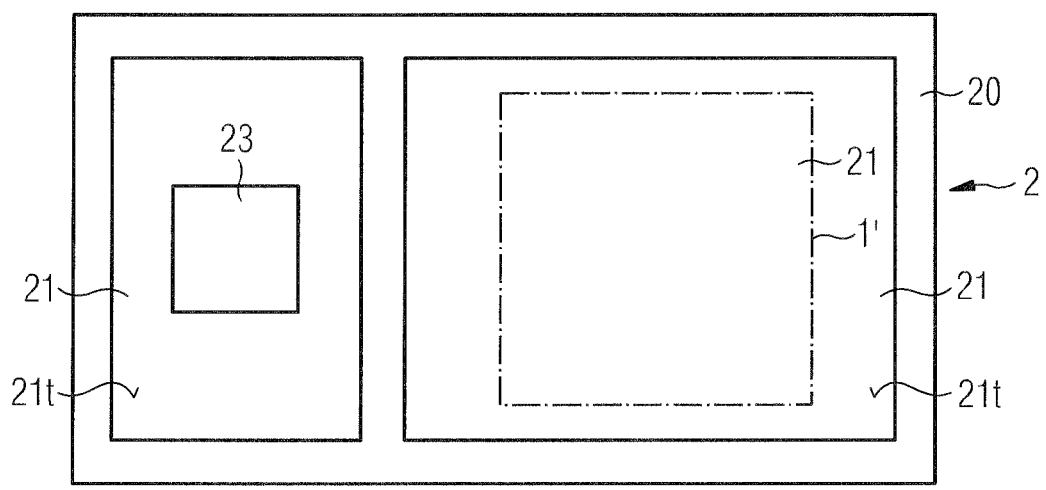
FIG. 4 is a top-down view of the ceramic substrate coated with an anti-oxidation layer as shown in FIG. 2.

Referring now to FIG. 4 there is illustrated a top-down view of the ceramic substrate as shown in FIG. 2, showing, by the broken line, a predefined chip mounting area 1' on the top side 21t of the top substrate metallization 21 for later bonding a power semiconductor chip to the top substrate metallization 21 by diffusion soldering.

For this purpose the second anti-oxidation layer 23 is coated on the blank, i.e. totally or at least mainly free of oxide or copper oxide, top side 21t of the top substrate metallization 21 so that the chip mounting area 1' remains exposed, i.e. not covered by the second anti-oxidation layer 23, resulting in the top side 21t existing as a blank metal surface free of oxide within the chip mounting area 1'.

Figure 5:
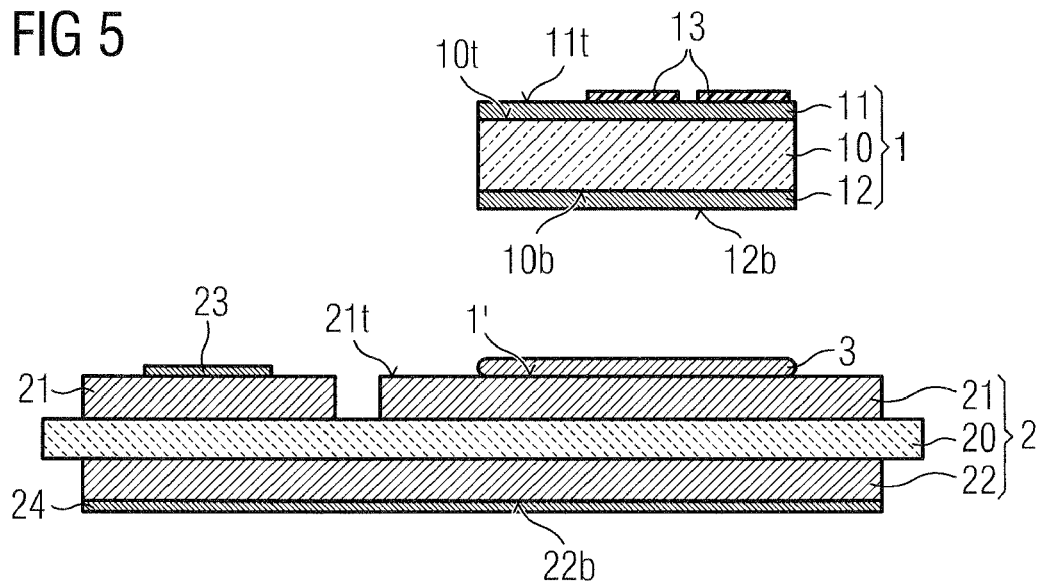
FIG. 5 illustrates a step in the method in which a tin containing solder is positioned between the power semiconductor chip and the ceramic substrate.

Referring now to FIG. 5 there is illustrated how a tin containing solder 3 is positioned between the bottom chip metallization 12 of the power semiconductor chip 1 as shown in FIGS. 1 and 3 and the chip mounting area 1' of the substrate 2 as shown in FIGS. 2 and 4. The solder 3 may be a paste or a pre-formed pad, for example, and—as shown in FIG. 5—coated or deposited on the chip mounting area 1'. As an alternative, or in addition thereto, the tin containing solder could also be applied to the bottom side 12b of the bottom chip metallization 12. Where the bottom chip metallization 12 is provided with a tin containing solder 3, the latter is applied to the bottom side 10b of the former before the power semiconductor chip 1 is made available as the last metallization.

Figure 6:
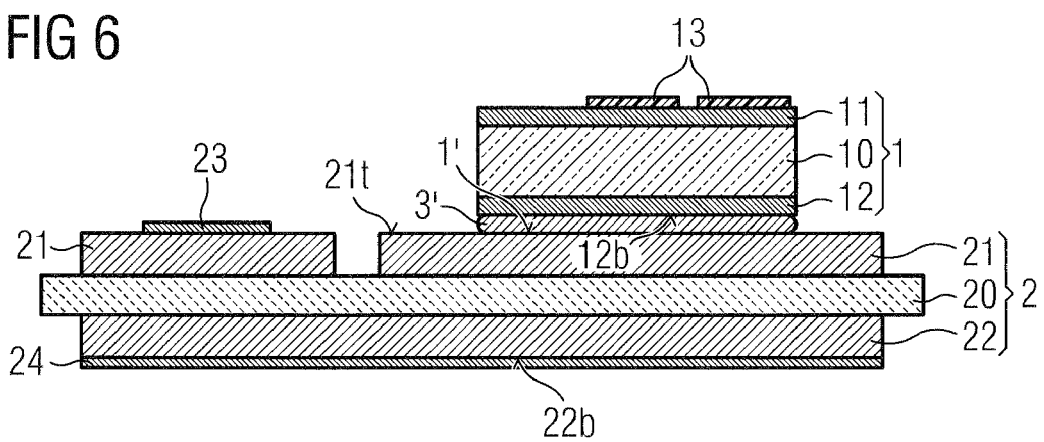
FIG. 6 is a vertical section through the assembly as shown in FIG. 5 after production of a diffusion solder bond between the power semiconductor chip and the ceramic substrate.

Referring now to FIG. 6 there is illustrated how after positioning of the solder 3 the bottom side 12b of the bottom chip metallization 12 and the top side 21t of the top substrate metallization 21 are brought into contact with the solder 3 in the region of the chip mounting area 1' and how the solder 3 is rendered molten and recooled so that copper from the bottom side 12b of the bottom chip metallization 12 or from the top side 21t of the top substrate metallization 21 in the chip mounting area 1' penetrates into the molten tin solder 3 to form therein intermetallic copper tin phases, e.g. Cu3Sn and/or Cu3Sn5 featuring a very high melting point of at least approx. 415° C. so that once the solder 3 has cooled a high-temperature compatible diffusion solder layer diffusion solder layer 3' materializes securely bonding the power semiconductor chip 1 to the substrate 2.

Figure 7:
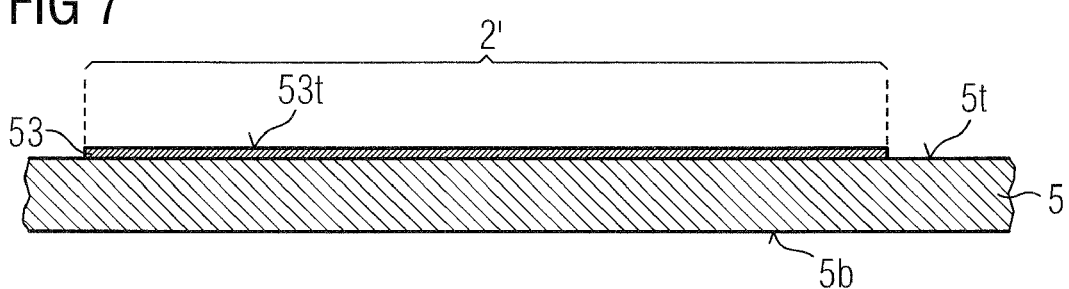
FIG. 7 illustrates a base plate topped by a layer of precious metal.

Referring now to FIG. 7 there is illustrated a vertical section through a portion of a base plate 5 for a power semiconductor module. The base plate 5 may totally or mainly comprise, for example, copper or a copper alloy or of aluminum or an aluminum alloy, e.g. aluminum silicon carbide (AlSiC).

The base plate is topped at the top side 5t in a predefined substrate mounting area 2' by a second precious metal layer 53, for example of silver or an alloy of gold and nickel. Coating the base plate with the second precious metal layer 53 can be done selectively, as shown, but it is just as possible that the base plate 5 is fully coated by any suitable coating technique such as electroplating, sputtering or vacuum deposition.

A base plate 5 mainly comprising aluminum or an aluminum alloy can be coated (from the inside outwards) with a sequence of layers of titanium, nickel and silver or titanium, nickel and gold.

Referring now to FIG. 8 there is illustrated how a silver containing paste 4, for instance a paste of silver powder and a solvent, can be positioned between the bottom side 24b of the first precious metal layer 24 and the top side 53t of the second precious metal layer 53. For this purpose the silver containing paste 4 is applied to the top side 53t of the second precious metal layer 53 and/or (not shown) to the bottom side 24b of the first precious metal layer 24, after which the ceramic substrate 2 componented with the power semiconductor chip 1 is located on the base plate 5 so that the first precious metal layer 24 and second precious metal layer 53 face each other. The componented substrate 2 is then pressed into contact with the base plate 5 in an oxygen atmosphere at a predefined contact pressure F1, ranging for example from 1 MPa to 30 MPa at an elevated temperature ranging for example from 150° C. to 250° C. for a predefined period of time so that from the combination of the silver containing paste 4 and the oxygen contained in the atmosphere a high-temperature compatible sintered silver layer 4' materializes securely bonding the substrate 2 to the base plate 5 as illustrated in FIG. 9.

Figure 10:
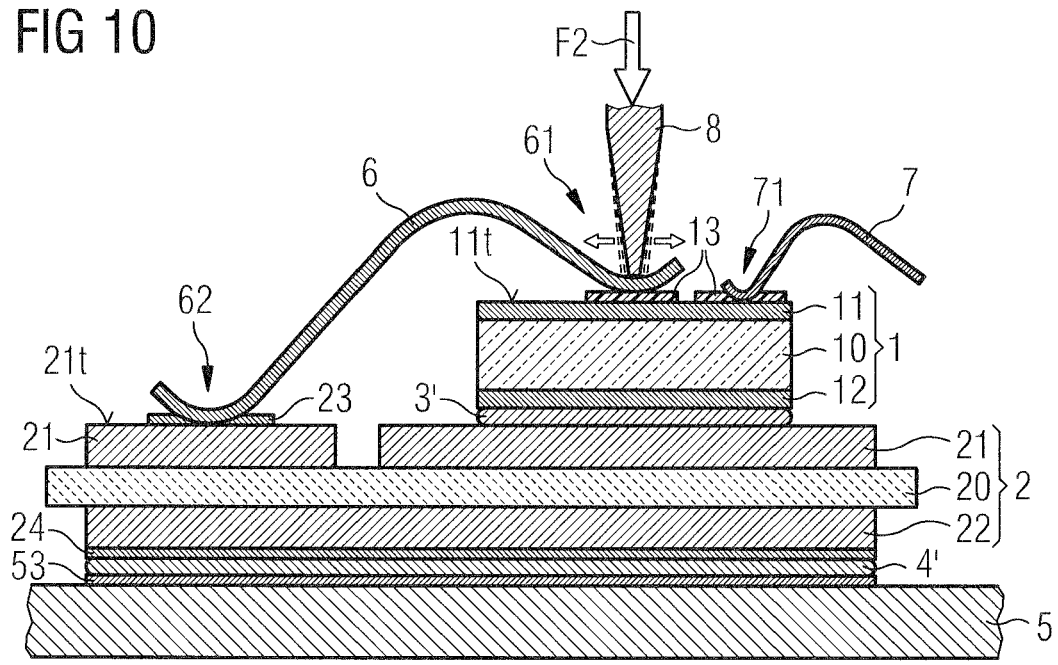
FIG. 10 illustrates a step in the method in which, in an assembly as existing after the step in the method as shown in FIG. 9, a bond wire is bonded to the top chip metallization in the region of the anti-oxidation layer coating the top chip metallization.

Once the power semiconductor chip 1 and the base plate 5 as well as the substrate 2 and the base plate 5 are securely bonded by means of the diffusion solder layer 3' and sintered silver layer 4' respectively the top chip metallization 11 and/or the top substrate metallization 21 can be bonded, as is illustrated in FIG. 10 by way of an example of the first bond area 61 to the top chip metallization 11.

Figure 11:
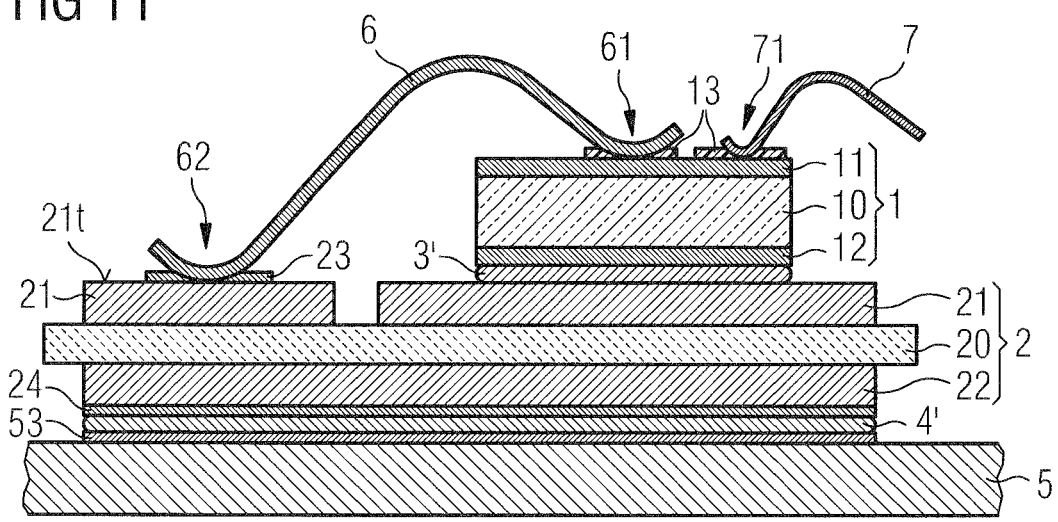
FIG. 11 illustrates a step in the method on completion of the bond in the assembly as shown in FIG. 10.

A portion of a bond wire 6 which may comprise copper or a copper alloy, for example, is positioned above the portions of the first anti-oxidation layer 13 and pressure contacted to the power semiconductor chip 1 by means of a bonding tool 8 oscillating roughly in the longitudinal direction of the bond wire portion from the effect of a contact pressure force F2 as is symbolized in FIG. 10 by two opposing arrows. In the further course of the bonding action the first anti-oxidation layer 13 beneath the bond area is locally broken and penetrated so that the portion of the bonding element 6 can come into direct contact with the top side 11t of the top chip metallization totally or mainly free of oxidation to achieve a secure and durable bond as is shown in FIG. 11.

Before the bond area 61 a further portion of the bond wire 6 is bonded in the same way to the top substrate metallization 21 in a zone located beneath the second anti-oxidation layer 23 where it is thus protected from oxidation.

Whilst the bond wire 6 has a diameter ranging from e.g. 300 μm to 1 mm, for example, 400 μm, for connecting a load terminal of the power semiconductor chip 1, a further thin bond wire 7 likewise comprises copper or a copper alloy and featuring a diameter less than 100 μm is bonded in the region of the gating terminal of the power semiconductor chip 1 to a further bond are 71 at the top chip metallization 11 as already explained for the bond area 61, for example.

At all bond area 61, 62 and 71 respectively the corresponding anti-oxidation layer 13 or 23 is windowed so that the corresponding bond wire 6 and 7 respectively comes directly into contact with the metal surface of the corresponding top chip metallization 11 and 21 respectively located beneath the corresponding anti-oxidation layer 13 and 23 respectively free of copper oxide in thus achieving a reliably secure bond.

Figure 12:
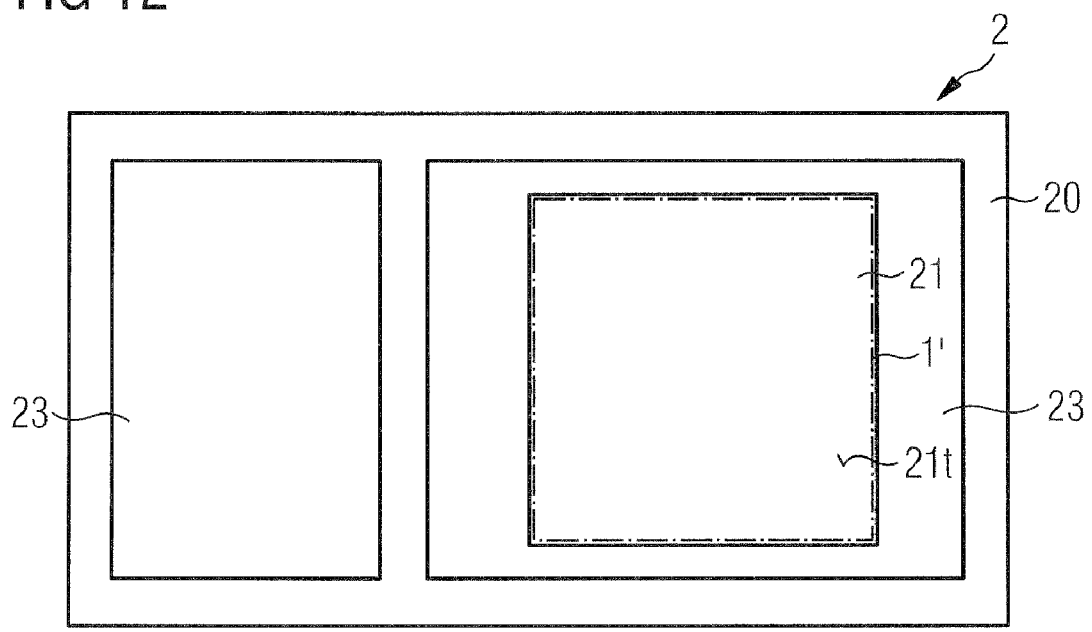
FIG. 12 is a top-down view of a ceramic substrate, the top substrate metallization of which is totally coated with an anti-oxidation layer except for a predefined chip mounting area.

Referring now to FIG. 12 there is illustrated a top-down view of an alternative embodiment of a ceramic substrate 2 in which, except for the predefined chip mounting area 1' the top side of the top substrate metallization 21 is totally covered by the second anti-oxidation layer 23. In the predefined chip mounting area 1' the top side 21t of the top substrate metallization 21 is totally or mainly free of any oxide, so that there is no problem in diffusion soldering this blank surface.

It is understood that instead of individual or all bond wires 6, 7 shown in the FIGS. 10 and 11 metal ribbons may also be employed, comprising copper or containing copper, for example.

Although various examples to realize the invention have been disclosed, it will be apparent to those skilled in the art that various changes and modifications can be made which will achieve some of the advantages of the invention without departing from the spirit and scope of the invention. Those reasonably skilled in the art will recognize that other components performing the same functions may be suitably substituted. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for fabricating a power semiconductor module comprising:
    providing a power semiconductor chip comprising a semiconductor bulk with a top side topped by a top chip metallization and a bottom side bottomed by a bottom chip metallization, said top chip metallization and said bottom chip metallization comprising copper or copper alloy;
    providing a substrate comprising a flat ceramic carrier with a top side topped by a top substrate metallization and a bottom side bottomed by a bottom substrate metallization, said top substrate metallization and said bottom substrate metallization comprising copper or copper alloy;
    coating the top chip metallization with a first anti-oxidation layer which comprises silicon nitride or silicon oxide so that the first anti-oxidation layer covers at least part of the side of the top chip metallization facing away from the semiconductor bulk;
    defining a chip mounting area on the top substrate metallization at which the power semiconductor chip is to be bonded to the top substrate metallization;
    coating the bottom substrate metallization with a first layer of precious metal so that the first layer of precious metal covers at least part of the side of the bottom substrate metallization facing away from the semiconductor bulk;
    positioning a tin comprising solder between the bottom chip metallization and the chip mounting area;
    producing a diffusion solder layer by melting and subsequently cooling the solder securely bonding the semiconductor chip to the top substrate metallization at the bottom chip metallization in the chip mounting area;
    providing a base plate comprising a top side;
    coating the top side of the base plate with a second precious metal layer;
    positioning a silver comprising paste between the second precious metal layer and the first precious metal layer applied to the bottom substrate metallization;
    producing a sinter bonding layer between the substrate and the base plate by urging the substrate against the base plate with a contact pressure over a predefined range of temperature and for a predefined time;
    providing a bonding element in the form of a bond wire or metal ribbon; and
    producing a direct bond between the bonding element and the top chip metallization by positioning a portion of the bonding element by means of a bonding tool on the first anti-oxidation layer and urging the bonding element into contact with the power semiconductor chip by locally breaking and penetrating the first anti-oxidation layer.

2. The method as set forth in claim 1, wherein said first anti-oxidation layer comprises silver or a silver alloy.

3. The method as set forth in claim 2, wherein said first anti-oxidation layer ranges in thickness from less than 1 µm or less than 500 nm.

4. The method as set forth in claim 1, wherein said first anti-oxidation layer ranges in thickness from 10 nm to 400 nm.

5. The method as set forth claim 1, wherein said first precious metal layer comprises silver or a silver alloy.

6. The method as set forth claim 1, wherein said second precious metal layer comprises silver, a silver alloy or an alloy of gold and nickel.

7. The method as set forth claim 1, wherein said bonding element is configured as a bond wire.

8. The method as set forth in claim 7, wherein said bond wire has a diameter ranging from 300 µm to 1 mm.

9. The method as set forth in claim 1, wherein said bonding element is configured as a metallic ribbon.

10. The method as set forth in claim 1, wherein said bonding element comprises copper or a copper alloy.

11. The method as set forth in claim 1, wherein said first anti-oxidation layer with the exception of the chip mounting area is applied to the full top side of the top substrate metallization.

12. The method as set forth in claim 1, wherein said top side of the top chip metallization is free of copper oxide during application of the first anti-oxidation layer.

13. The method as set forth in claim 1, wherein said top side of the top chip metallization is free of copper oxide during application of the first anti-oxidation layer.

14. The method as set forth in claim 1, further comprising applying a second anti-oxidation layer to the top substrate metallization so that the chip mounting area remains free from being covered by the second anti-oxidation layer.

15. The method as set forth in claim 14, wherein said second anti-oxidation layer comprises silver or a silver alloy.

16. The method as set forth in claim 14, wherein a further bond is produced between the bonding element and a further bonding element and the top substrate metallization by positioning a further portion of the bonding element or portion of the further bonding element on the second anti-oxidation layer by means of a bonding tool and locally breaking and penetrating the second anti-oxidation layer and making a direct contact between the bonding element and the top substrate metallization.

17. The method as set forth in claim 1, wherein
producing the sintered bonding layer is done after producing the diffusion solder layer; and
producing the bond is done after producing the sintered bonding layer.

18. The method as set forth in claim 1, wherein the tin containing solder is applied to the bottom side of the bottom chip metallization as a last metallization layer of the semiconductor chip.

19. A method for fabricating a power semiconductor module comprising:
providing a power semiconductor chip having a top chip metallization and an opposing bottom chip metallization, the top chip metallization and the bottom chip metallization comprising copper or copper alloy, the top chip metallization having a bonding region coated with an anti-oxidation layer which comprises silicon nitride or silicon oxide;
providing a substrate comprising a flat ceramic carrier having a top substrate metallization and an opposing bottom substrate metallization, the top substrate metallization and the bottom substrate metallization comprising copper or copper alloy;
diffusion soldering the bottom chip metallization to the top substrate metallization in a chip mounting area of the substrate via a diffusion solder layer having intermetallic copper tin phases, after the bonding region of the top chip metallization is coated with the anti-oxidation layer;
sinter bonding the bottom substrate metallization to a base plate in an oxygen-containing atmosphere via a sintered silver layer after the bottom chip metallization is diffusion soldered to the top substrate metallization by urging the substrate against the base plate with a contact pressure over a predefined range of temperature and for a predefined time, the anti-oxidation layer preventing oxidation of the bonding region of the top chip metallization during the sinter bonding; and
bonding a bonding element to the bonding region of the top chip metallization after the substrate is sinter bonded to the base plate by positioning a portion of the bonding element on the anti-oxidation layer and urging the bonding element into contact with the power semiconductor chip by locally breaking and penetrating the anti-oxidation layer.

* * * * *